(12) United States Patent
Higashionji et al.

(10) Patent No.: US 8,314,533 B2
(45) Date of Patent: Nov. 20, 2012

(54) VIBRATORY ACTUATOR

(75) Inventors: Masaru Higashionji, Osaka (JP);
Hideaki Mukae, Hyogo (JP); Eiichi Nagaoka, Hyogo (JP); Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 309 days.

(21) Appl. No.: 12/738,353

(22) PCT Filed: Jul. 29, 2008

(86) PCT No.: PCT/JP2008/002017
§ 371 (c)(1),
(2), (4) Date: Jun. 8, 2010

(87) PCT Pub. No.: WO2009/050836
PCT Pub. Date: Apr. 23, 2009

(65) Prior Publication Data
US 2010/0301704 A1   Dec. 2, 2010

(30) Foreign Application Priority Data
Oct. 18, 2007   (JP) ................................. 2007-271707

(51) Int. Cl.
*H02N 2/00* (2006.01)
(52) U.S. Cl. ......... 310/323.09; 310/323.02; 310/323.17; 310/328
(58) Field of Classification Search ............. 310/323.01, 310/323.02, 323.08, 323.09, 323.13, 323.14, 310/323.16, 323.17, 328
See application file for complete search history.

(56) References Cited

U.S. PATENT DOCUMENTS

| | | | | |
|---|---|---|---|---|
| 6,104,123 A | * | 8/2000 | Okazaki et al. | 310/323.09 |
| 7,602,104 B2 | * | 10/2009 | Sakamoto | 310/323.09 |
| 7,656,073 B2 | * | 2/2010 | Doshida et al. | 310/330 |
| 2012/0217844 A1 | * | 8/2012 | Tani | 310/328 |

FOREIGN PATENT DOCUMENTS

| | | | |
|---|---|---|---|
| JP | 07-095781 | | 4/1995 |
| JP | 10-285962 | | 10/1998 |
| JP | 2000-134961 | | 5/2000 |
| JP | 2000-134961 A | * | 5/2000 |
| JP | 2006-333571 | | 12/2006 |

OTHER PUBLICATIONS

Search Report for corresponding International Application No. PCT/JP2008/002017 mailed Aug. 26, 2008.
Form PCT/ISA/237.

* cited by examiner

*Primary Examiner* — Thomas Dougherty
(74) *Attorney, Agent, or Firm* — Renner, Otto, Boisselle & Sklar, LLP

(57) ABSTRACT

A supporting structure for an actuator body, which can prevent reduction of vibration of an actuator body and maintain a contact state of a driver element with an abutment body in a stable manner even when the driver element receives reactive force from the abutment body is realized.

An ultrasonic actuator (2) includes an actuator body (4) for generating vibration, driver elements (8), provided on a mounting surface (40*a*) of the actuator body (4), for outputting driving force, a pressing rubber (62) for pressing the actuator body (4) to a stage (11), a case (5) to which the actuator body (4) is coupled, and a plate spring (61) for elastically supporting the actuator body (4) relative to the case (5). The plate spring (61) supports the mounting surface (40*a*) of the actuator body (4) on which the driver elements 8 are provided.

3 Claims, 12 Drawing Sheets

VIBRATORY ACTUATOR

TECHNICAL FIELD

The present invention relates to a vibratory actuator for driving a movable body, the vibratory actuator including an actuator body, including a piezoelectric element, for generating vibration.

BACKGROUND ART

Conventionally, a vibratory actuator has been known in which an electric field is applied to an actuator body including a piezoelectric element to vibrate the actuator body so that a drive element provided to the actuator body is operated to output driving force. Such vibratory actuators have been used in ultrasonic motors and other apparatuses which are required to move in microstep move.

For example, a vibratory actuator according to PATENT DOCUMENT 1 includes an actuator body including a piezoelectric element, a driver element, provided on the actuator body, for outputting driving force to a movable body, and a pressurizing member for pressing the actuator body from an opposite side to a side of the actuator body at which the driver element is provided. In the vibratory actuator, the actuator body is pressed by the pressurizing member to one (hereinafter referred to as an "abutment body") of a fixed body and the movable body on which the driver element abuts, and a certain amount of friction force between the driver element and the abutment body is maintained. In this state, an alternating voltage is applied to the piezoelectric element of the actuator body to cause the actuator body to induce vibration, thereby causing the driver element to make an elliptical motion. Thus, increase and reduction of friction force between the driver element and the abutment body are repeated by causing the driver element to make an elliptical motion, so that driving force is output from the driver element to the movable body by friction force when the friction force is increased to drive the movable body in a predetermined direction.

It should be noted that the pressurizing member not only functions to press the actuator body to the abutment body but also functions as a supporting member for supporting the actuator body.

CITATION LIST

Patent Document

PATENT DOCUMENT 1: Japanese Patent Publication No. 2006-333571

SUMMARY OF THE INVENTION

Technical Problem

When driving force is output from the actuator body to the movable body via the driver element, reactive force acts on the actuator body from the abutment body via the driver element. Reactive force increases in proportion to driving force.

However, as in the vibratory actuator of PATENT DOCUMENT 1, in the configuration in which the actuator body is elastically supported, when reactive force is particularly large, the actuator body itself is displaced due to the reactive force.

Specifically, reactive force which acts on the driver element acts as a moment of which a center is the pressurizing member which elastically supports the actuator body, and thus, the actuator body is rotationally displaced around the pressurizing member. As a result, friction force between the driver element and the abutment body is reduced, or the driver element moves away from the abutment body, so that a contact state of the driver element with the abutment body is unstable, and furthermore, the operation of the vibratory actuator is unstable.

If the actuator body is non-elastically supported in order to prevent the displacement of the actuator body due to reactive force from the abutment body, vibration of the actuator body is reduced. As a result, the vibration displacement of the actuator body is reduced, and furthermore, driving force is reduced.

In view of the foregoing, the present invention has been devised, and it is therefore an object of the present invention to realize a supporting structure for an actuator body, which can prevent reduction of vibration of the actuator body and maintain a contact state of a driver element with an abutment body in a stable manner even when the driver element receives reactive force from the abutment body.

Solution to the Problem

The present invention provides a configuration in which an actuator body is elastically supported near a driver element.

Specifically, the present invention provides a vibratory actuator for driving a movable body provided to be movable relative to a fixed body. The vibratory actuator includes: an actuator body, including a piezoelectric element, for generating vibration, a driver element provided on one side surface of the actuator body and configured to be operated according to the vibration of the actuator body, thereby outputting driving force, a pressurizing member, provided at an opposite side to a side of the actuator body at which the driver element is provided, for pressing the actuator body to one of the fixed body and the movable body on which the driver element abuts, a base member to which the actuator body is coupled, and a supporting member for elastically supporting the actuator body relative to the base member, the supporting member supports end portions of the actuator body including a surface on which the driver element is provided.

In the above-described configuration, the end portions of the actuator body including a surface on which the driver element is provided are supported by the supporting member. That is, the actuator body is supported near the driver element, and accordingly, the distance between the driver element and the supporting member is small. Thus, even when the driver element receives reactive force from one (the abutment body) of the fixed body and the movable body on which the driver element abuts, a moment around the supporting member which acts on the actuator body is small, so that the rotational displacement of the actuator body around the supporting member can be reduced.

Advantages of the Invention

According to the present invention, an actuator body is elastically supported by a supporting member at end portions of the actuator body including a surface on which a driver element is provided. Thus, the actuator body can be supported without interfering the vibration of the actuator body and, in addition, the distance between the driver element and the supporting member is reduced. Accordingly, even when the driver element receives reactive force from an abutment body, the rotational displacement of the actuator body can be reduced, and the contact state of the driver element with the abutment body can be maintained in a stable manner.

BRIEF DESCRIPTION OF THE DRAWINGS

FIG. 10(a) shows a state before the stage is driven. FIG. 10(b) shows a state where the actuator body expands along the longitudinal direction and thereby one of driver elements drives a stage. FIG. 10(c) shows a state where the actuator body contracts along the longitudinal direction and thereby the other one of the driver elements drives the stage.

Figure 1:
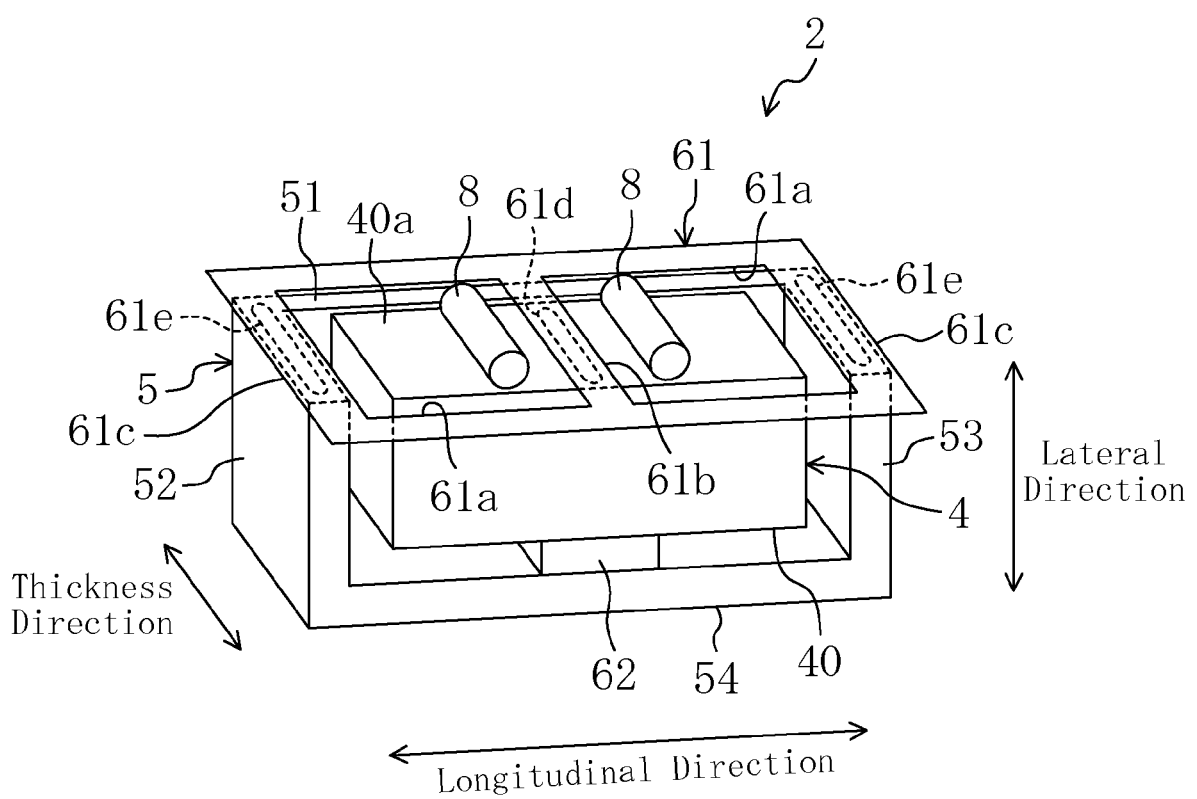
FIG. 1 is a perspective view of an ultrasonic actuator according to a first embodiment.

DESCRIPTION OF REFERENCE CHARACTERS 1, 301, 501, 601, 701 Drive unit
11, 15 Stage (movable body)
13 Fixed frame (base member, fixed body)
17a Abutment member (fixed body)
19, 20 Circular plate body (movable body)
2, 202, 302, 402 Ultrasonic actuator (vibratory actuator)
4 Actuator body
5, 205 Case (base member)
61, 261, 361 Plate spring (supporting member)
461 Supporting member
62 Pressing rubber (pressurizing member)
362 Pressing plate spring (pressurizing member)
8 Driver element

DESCRIPTION OF EMBODIMENTS

Embodiments will be described hereinafter in detail with reference to the accompanying drawings.

First Embodiment

Figure 2:
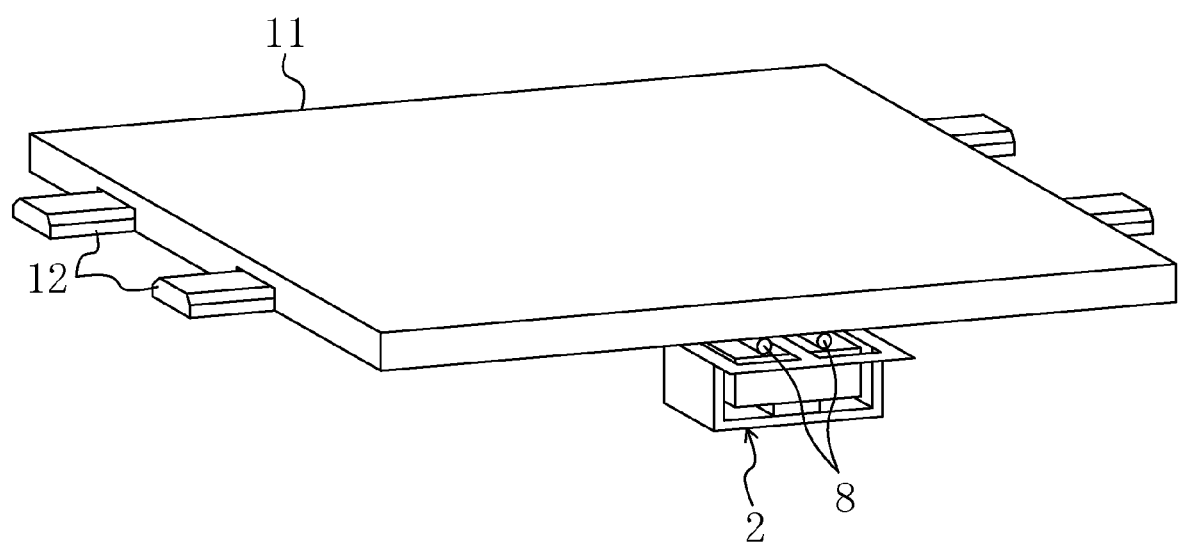
FIG. 2 is a perspective view of a drive unit.

As shown in FIG. 2, a drive unit 1 according to a first embodiment includes a stage 11, an ultrasonic actuator 2, and a control unit (not shown) for performing drive control of the ultrasonic actuator 2. The drive unit 1 serves as a very thin precision drive mechanism which can perform its operation in a stable manner. Therefore, the drive unit 1 is used for auto-focusing, zooming, blur correction, or the like of a camera or the like.

The stage 11 is attached to guides 12, fixed on a base (not shown) as a fixed body in parallel to one another, to be capable of sliding. That is, the stage 11 is configured to be movable along a direction in which the guides 12 extend. The stage 11 serves as a movable body. The direction in which the guides 12 extend is a moving direction of the stage 11. The stage 11 is a plate member having an approximately square shape when viewed from the top, and is made of alumina. The material of the stage 11 is not limited to alumina, but the stage 11 may be made of any material. The ultrasonic actuator 2 is placed so that driver elements 8, which will be described later, are in contact with a back surface of the stage 11 (on which the guides 12 are provided).

As shown in FIG. 1, the ultrasonic actuator 2 includes an actuator body 4 for generating vibration, driver elements 8 for transmitting driving force of the actuator body 4 to the stage 11, a case 5 for housing the actuator body 4, a plate spring 61 for elastically supporting the actuator body 4 relative to the case 5, and a pressing rubber 62 for pressing the actuator body 4 to the stage 11. The ultrasonic actuator 2 serves as a vibratory actuator.

The actuator body 4 is formed of a piezoelectric element unit 40.

The piezoelectric element unit 40 has an approximately rectangular parallelepiped shape including a pair of principal surfaces each having an approximately rectangular shape and being opposed to one another, a pair of long side surfaces each being perpendicular to each of the principal surfaces, extending along longitudinal directions of the principal surfaces and being opposed to one another, and a pair of short side surfaces each being perpendicular to each of the principal surfaces and the long side surfaces, extending along lateral directions of the principal surfaces and being opposed to one another.

Figure 3:
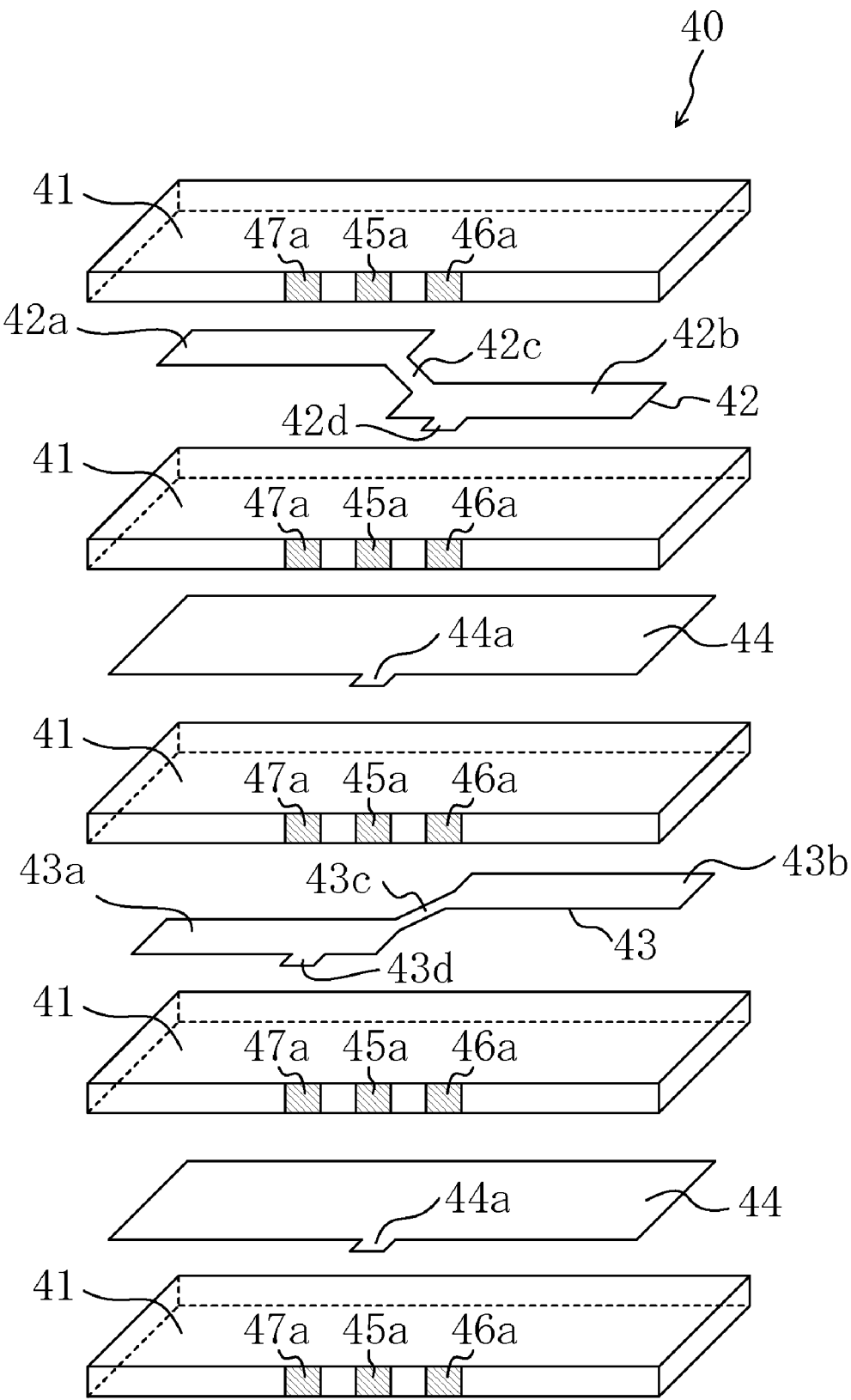
FIG. 3 is an exploded perspective view of a piezoelectric element unit.

As shown in FIG. 3, the piezoelectric element unit 40 includes five piezoelectric element layers (piezoelectric elements) 41 and four internal electrode layers 42, 44, 43 and 44, which are alternately stacked. Specifically, the internal electrode layers 42, 44, 43 and 44 are, respectively, a first power supply electrode layer 42, a common electrode layer 44, a second power supply electrode layer 43 and another common electrode layer 44, which are alternately provided in a stacking direction with each of the piezoelectric element layers 41 interposed between any two of the internal electrode layers. Each of the first power supply electrode layer 42, the second power supply electrode layer 43 and the common electrode layers 44 is printed on an associated one of the piezoelectric element layers 41.

Each of the piezoelectric element layers 41 is an insulating layer, for example, made of a ceramic material such as lead zirconate titanate, and has an approximately rectangular parallelepiped shape including a pair of principal surfaces, a pair of long side surfaces and a pair of short side surfaces in the same manner as the piezoelectric element unit 40. In each of the piezoelectric element layers 41, external electrodes 47a, 45a and 46a are formed in a center part of one of the long side surfaces in the longitudinal direction so as be insulated from one another and be arranged in line.

Each of the common electrode layers 44 has an approximately rectangular shape provided on an approximately entire principal surface of an associated one of the piezoelectric element layers 41. Moreover, a lead electrode 44a is formed in one of long side portions of each of the common electrode layers 44 to extend from a center portion thereof in the longitudinal direction to the external electrode 45a of the piezoelectric element layer 41.

Figure 4:
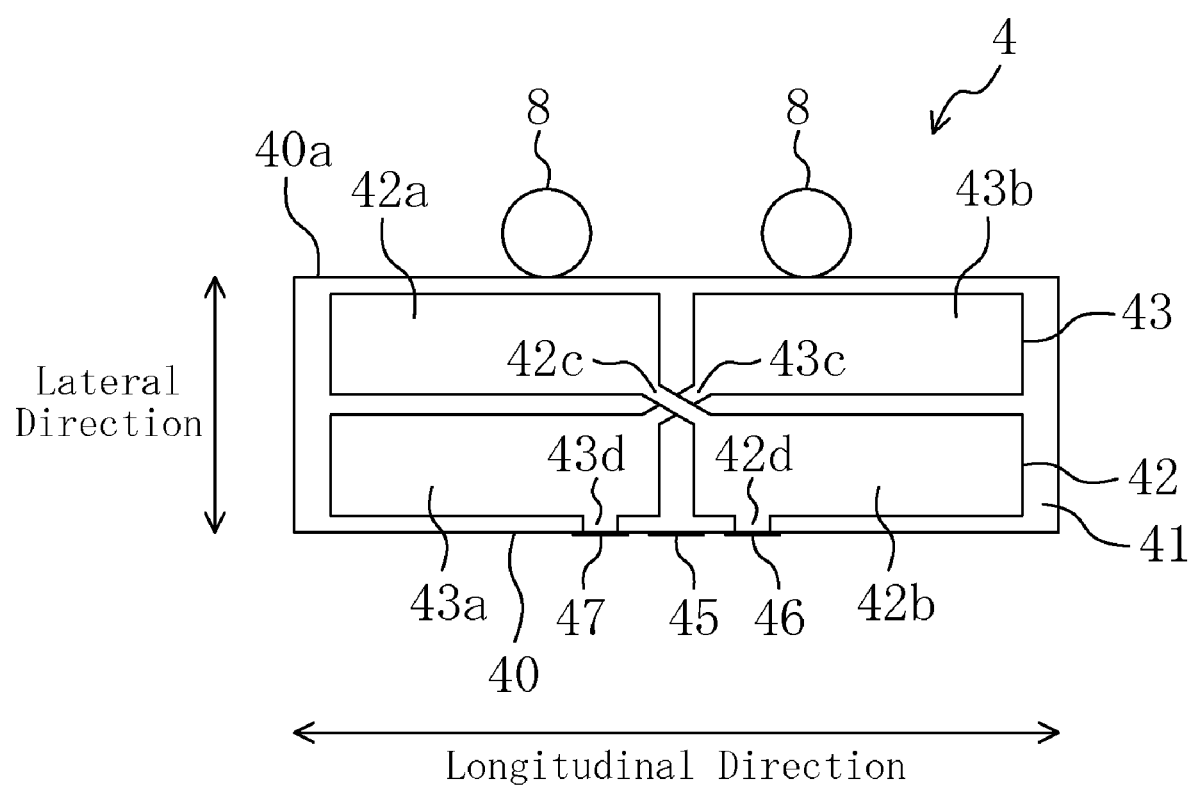
FIG. 4 is a schematic front view illustrating a configuration of an actuator body.

Suppose that the principal surface of each of the piezoelectric element layers 41 is divided in four areas, i.e., two areas in the longitudinal direction and two areas in the lateral direction. As shown in FIG. 4, the first power supply electrode layer 42 includes first electrodes 42a and 42b respectively formed in one pair of the areas located in one diagonal direction of the principal surface, and a conductive electrode 42c for connecting the first electrodes 42a and 42b to bring them in conduction. Each first electrode 42a (42b) is an electrode having an approximately rectangular shape and overlaps with the common electrode layers 44 when viewed in the stacking direction. That is, each first electrode 42a (42b) is opposed to an associated one of the common electrode layers 44 with an associated one of the piezoelectric element layers 41 interposed therebetween. One of the first electrodes 42a and 42b, i.e., the first electrode 42b is provided with a lead electrode 42d extending to the external electrode 46a of the piezoelectric element layer 41.

The second power supply electrode layer 43 includes a pair of second electrodes 43a and 43b respectively formed in the other pair of the areas located in the other diagonal direction of the principal surface, and a conductive electrode 43c for connecting the second electrodes 43a and 43b to bring them in conduction. When viewed in the stacking direction, the second electrode 43a is provided in one area of the other pair, which is located adjacent to the first electrode 42a in the lateral direction and adjacent to the first electrode 42b in the longitudinal direction, and the second electrode 43b is provided in the other area of the same pair, which is located adjacent to the first electrode 42a in the longitudinal direction and adjacent to the first electrode 42b in the lateral direction. Each second electrode 43a (43b) is an electrode having an approximately rectangular shape and overlaps with the common electrode layers 44, when viewed in the stacking direction. That is, each second electrode 43a (43b) is opposed to an associated one of the common electrode layers 44 with an associated one of the piezoelectric element layers 41 interposed therebetween. Moreover, one of the second electrodes 43a and 43b, i.e., the second electrode 43a is provided with a lead electrode 43d extending to the external electrode 47a of the piezoelectric element layer 41.

In the piezoelectric element unit 40 formed by alternately stacking the piezoelectric element layers 41 and the internal electrode layers 42, 44, 43 and 44, the external electrodes 47a, 45a and 46a of the piezoelectric element layers 41 are provided in a center portion of one long side surface thereof in the longitudinal direction so that the electrodes 47a, 45a and 46a are respectively aligned in the stacking direction, thereby forming integrated external electrodes 47, 45 and 46, respectively. The lead electrode 43d of the second power supply electrode layer 43 is electrically connected to the integrated external electrode 47. The lead electrodes 44a provided to the common electrode layers 44 are electrically connected to the integrated external electrode 45. The lead electrode 42d of the first power supply electrode layer 42 is electrically connected to the integrated external electrode 46.

On the other long side surface (specifically, one of the pair of surfaces facing in a vibration direction of bending vibration which will be described later and will hereinafter be also referred to as a "mounting surface") 40a of the piezoelectric element unit 40 in which the external electrodes 45a are not provided, two driver elements 8 are provided.

Each of the driver elements 8 is formed to have a cylindrical shape. The driver elements 8 are made of zirconia, alumina, silicon nitride, silicon carbide, tungsten carbide, or the like.

Each of the driver elements 8 is provided on a mounting surface 40a by an adhesive bond so that an axis of the circular cylinder extends in parallel to a lateral direction of the mounting surface 40a (i.e., a thickness direction of the piezoelectric element unit 40). That is, the driver elements 8 are attached to the mounting surface 40a to be in line contact with the mounting surface 40a.

The adhesive bond is preferably made of a softer material than respective materials of the piezoelectric element unit 40 and the driver elements 8. Specifically, examples materials include synthetic resin, particularly, epoxy resin and silicone resin. The use of such materials allows the driver elements 8 to be reliably fixed with the mounting surface 40a while minimizing reduction of vibration of the piezoelectric element unit 40, which will be described later.

Moreover, the driver elements 8 are provided in parts of the mounting surface 40a located at a distance of 30% to 35% of the full length of the mounting surface 40a inwardly from both ends in the longitudinal direction of the piezoelectric element unit 40, respectively. That is, each of the locations of the driver elements 8 corresponds to an antinode of a second-order mode of bending vibration of the piezoelectric element unit 40 where vibration is maximum, which will be described later.

In the actuator body 4 configured in the above-described manner, the external electrode 45 is connected to ground, an alternating voltage at a predetermined frequency is applied to the external electrode 46, and an alternating voltage having a phase shifted from the phase of the alternating voltage by 90° is applied to the external electrode 47. Thus, alternating voltages which have different phases from one another by 90° are applied to the one pair of the first electrodes 42a and 42b and the other pair of the second electrode 43a and 43b, respectively, each of which is located in an associated one of the diagonal directions of the principal surface of each piezoelectric element layer 41, so that longitudinal vibration (i.e., so-called expanding/contracting vibration) along the longitudinal direction of the actuator body 4 and bending vibration (i.e., so-called lateral vibration) along the lateral direction of the actuator body 4 are induced.

Figure 5:
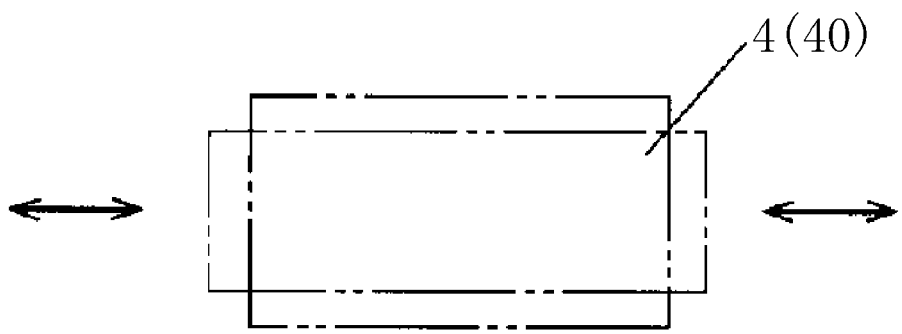
FIG. 5 is a conceptual diagram illustrating the displacement made by a first-order mode of longitudinal vibration of an actuator body along a longitudinal direction.
Figure 6:
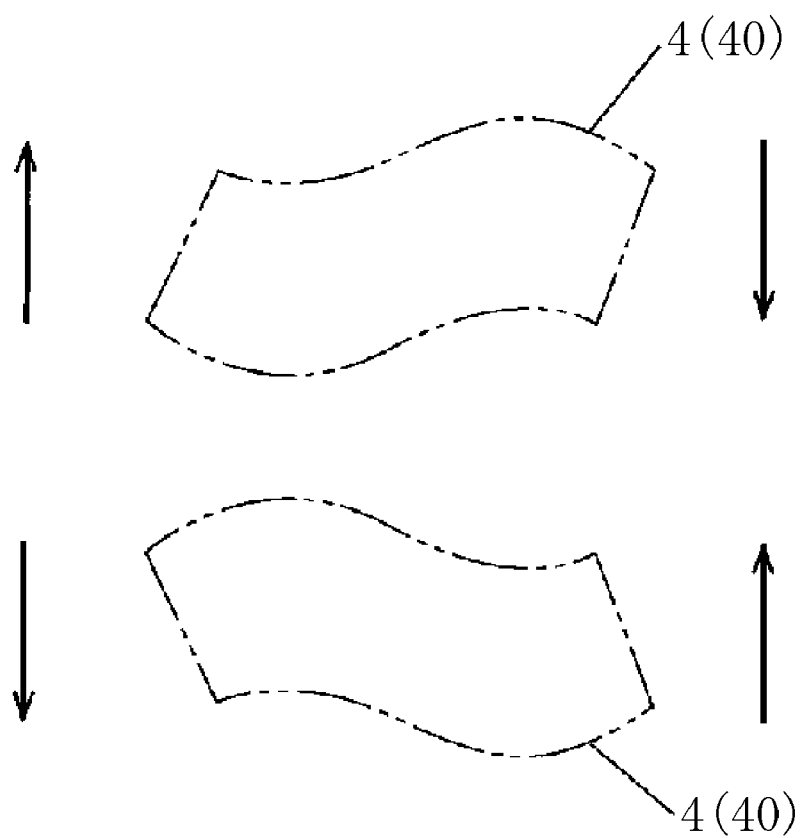
FIG. 6 is a conceptual diagram illustrating the displacement made by a second-order mode of bending vibration of the actuator body.
Figure 7:
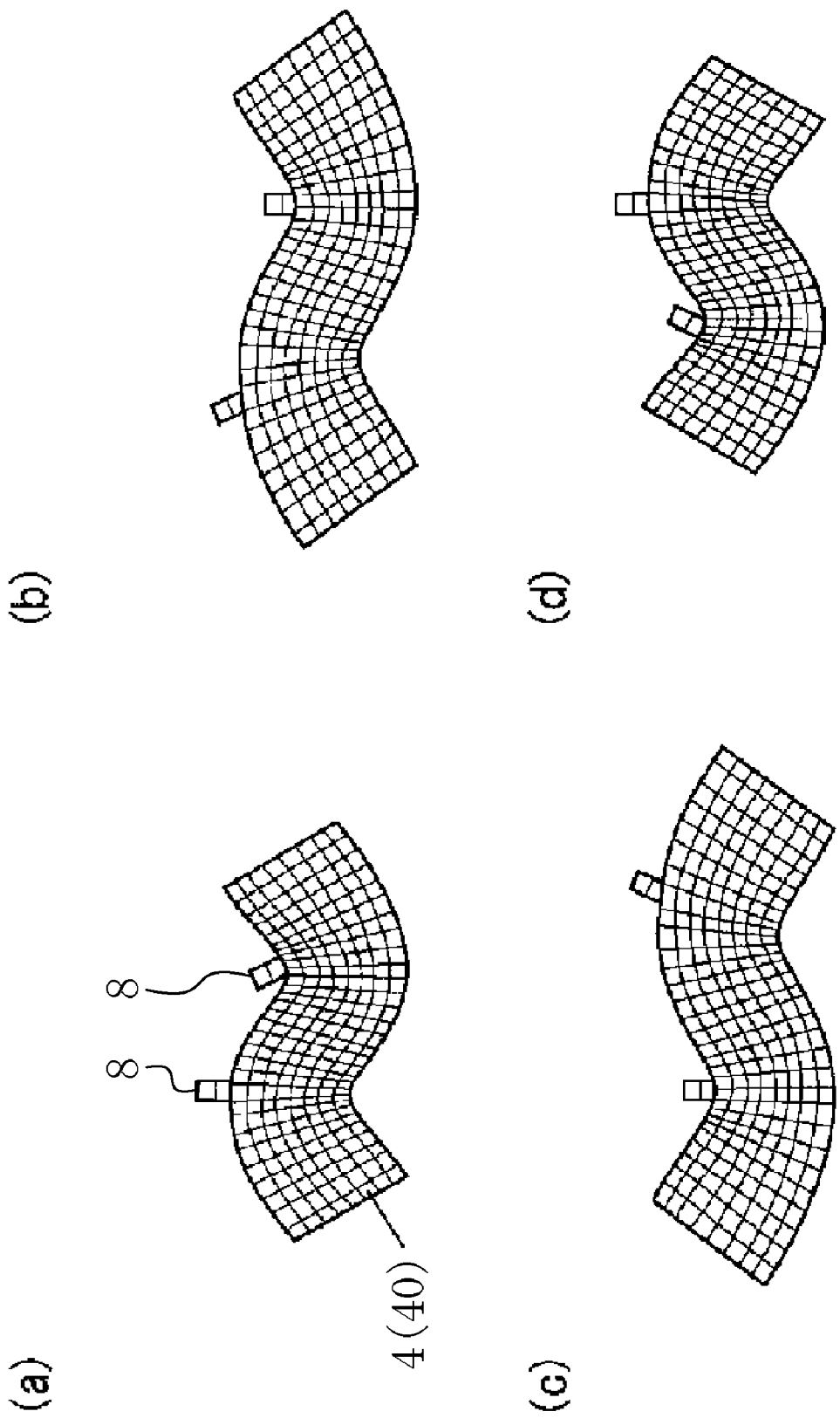
FIGS. 7(a)-7(d) are conceptual diagrams illustrating the operation of the actuator body.

Respective resonance frequencies of longitudinal vibration and bending vibration are determined by a material, a shape and the like of the actuator body 4, i.e., the piezoelectric element unit 40. Furthermore, both of the resonance frequencies are influenced by force supporting the actuator body 4 and a position where the actuator body 4 is supported. Considering this, the resonance frequencies are substantially matched to one another, and alternating voltages having a frequency around the resonance frequencies and phases shifted from one another by 90° are applied to the external electrodes 46 and 47, respectively. For example, in the piezoelectric element unit 40 designed to have a shape or the like which allows the respective resonance frequencies of a first-order mode of longitudinal vibration (see FIG. 5) and a second-order mode of bending vibration (see FIG. 6) to be matched to one another, alternating voltages having a frequency around the resonance frequencies and phases shifted from one another by 90° are applied. Thus, the first-order mode of longitudinal vibration and the second-order mode of bending vibration are harmonically induced in the actuator body 4, so that the actuator body 4 changes itself into shapes shown in FIGS. 7(a), 7(b), 7(c) and 7(d) in this order.

As a result, each of the driver elements 8 provided to the actuator body 4 makes an approximately elliptical motion, i.e., an orbit motion in a plane parallel to a principal surface of the actuator body 4 (i.e., a plane parallel to the drawing sheet of FIG. 7), i.e., in a plane including a longitudinal direction and a lateral direction.

The piezoelectric element unit 4 which is vibrated in the above-described manner has a plurality of antinodes of vibration. The antinode of the vibration means a position where the displacement of the vibration is a local maximum. According to this embodiment, there are two antinodes of longitudinal vibration located respectively at both of the short side surfaces of the actuator body 4, eight antinodes of bending vibration, i.e., four antinodes located at both of end portions of one of the long side surfaces of the actuator body 4 and both of end portions of the other one of the long side surfaces thereof, and four antinodes located at parts at a distance of 30% to 40% of the full length of the actuator body 4 inwardly from both ends of one of the long side surfaces and the other one of the long side surfaces in the longitudinal direction of the actuator body 4. That is, the actuator body 4 has ten antinodes of vibration including antinodes of longitudinal vibration and antinodes of bending vibration.

The driver elements 8 are provided to correspond to antinodes of bending vibration at parts of one of the long side surfaces of the actuator body 4 which is located at a distance of 30% to 35% of the full length of the long side surface inwardly from both ends of the long side surface.

The actuator body 4 also has a plurality of nodes of vibration. The node of vibration means a position where the displacement of the vibration is zero at all the time. According to this embodiment, there are two nodes of longitudinal vibration located respectively at center portions of both of the long side surfaces of the actuator body 4 in the longitudinal direction, and six nodes of bending vibration located at the center portions of both of the long side surfaces of the actuator body 4 in the longitudinal direction and at parts at a distance of 35% to 40% of the full length of the actuator body 4 outwardly from the center portions of both of the long side surfaces in the longitudinal direction. It should be noted that the nodes of bending vibration may be displaced depending on the shape of element. Two of the six nodes of bending vibration overlap with nodes of longitudinal vibration. That is, when longitudinal vibration and bending vibration are harmonically induced, common nodes appear only at the center portions of both of the long side surfaces of the actuator body 4 in the longitudinal direction.

The case 5 is made of resin and has an approximately rectangular parallelepiped box shape corresponding to the actuator body 4. The case 5 serves as a base member.

The case 5 includes a principal wall portion 51 which is parallel to the principal surface of the actuator body 4 and has an approximately rectangular shape, a first short side wall portion 52 provided at a short side portion located at one side of the principal wall portion 51 (i.e., the left side of FIG. 1) in the longitudinal direction, a second short side wall portion 53 provided at a short side portion located at the other side of the principal wall portion 51 (i.e., the right side of FIG. 1) in the longitudinal direction, and a long side wall portion 54 provided at a long side portion located at one side of the principal wall portion 51 (i.e., the lower side of FIG. 1) in the lateral direction. That is, the case 5 is configured so that no wall portion is provided at a side of the case 5 opposed to the principal wall portion 51 and a long side portion of the case 5 (corresponding to the long side surface of the actuator body 4 on which the driver elements 8 are provided) located at the other side of the principal wall portion 51 in the lateral direction (i.e., the upper side of FIG. 1) of the principal wall portion 51, so that the case 5 is open at the above-described one side in the stacking direction of the piezoelectric element unit 40 (in the normal direction of the principal wall portion 51) and at the above-described other side of the lateral direction.

The actuator body 4 is placed in the case 5 configured in the above-described manner. Specifically, the actuator body 4 is placed in the case 5 so that one of the principal surfaces thereof faces the principal wall portion 51 and one of the long side surfaces thereof (at which the external electrodes 47, 45 and 46 are provided) faces the long side wall portion 54. In this state, the driver elements 8 protrude from the case 5 at the above-described other side in the lateral direction.

Moreover, a pressing rubber 62 is provided between one of the long side surfaces of the actuator body 4 and the long side wall portion 54 of the case 5. The pressing rubber 62 abuts on not only the actuator body 4 and the long side wall portion 54 but also the inner surface of the principal wall portion 51.

Three electrodes (not shown) are provided to be insulated from one another at a part of the inner surface of the principal wall portion 51 on which the pressing rubber 62 abuts. Each of the electrodes is conductive to an associated one of terminal electrodes (not shown) provided on an outer surface of the principal wall portion 51.

Figure 8:
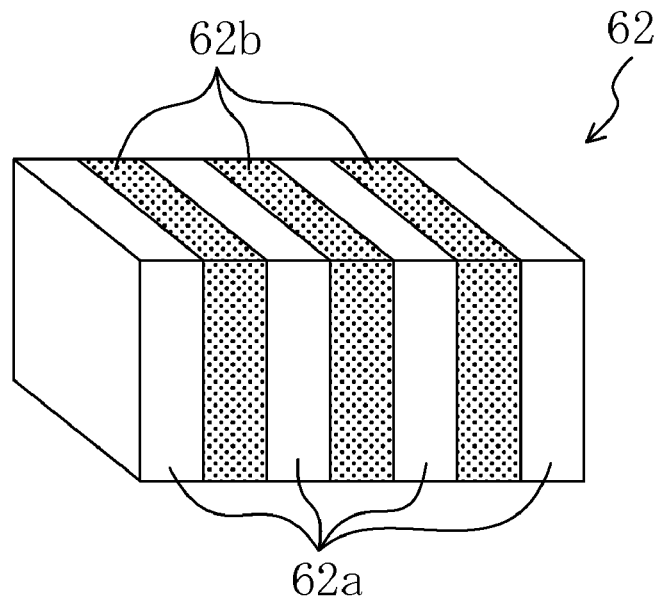
FIG. 8 is a schematic view illustrating a configuration of a pressing rubber.

As shown in FIG. 8, the pressing rubber 62 has an approximately rectangular parallelepiped shape, and includes insulating layers 62a and conductive layers 62b alternatively stacked. Each insulating layer 62a is made of silicone rubber, and four insulating layers 62a are provided. Each conductive layer 62b is made of conductive rubber obtained by mixing metal powder into silicone rubber, and three conductive layers 62b are provided. The pressing rubber 62 having the above-described configuration is placed so that a stacking direction thereof extends along the longitudinal direction of the actuator body 4. In this case, a part of each of the three conductive layers 62b which faces the actuator body 4 is in contact with an associated one of the external electrodes 47a, 45a and 46a of the actuator body 4, and a part of each of the three conductive layers 62b which faces the principal wall portion 51 of the case 5 is in contact with an associated one of the three electrodes formed on the inner surface of the case 5. Thus, the pressing rubber 62 provides electrical conduction between each of the three electrodes which are conductive to the terminal electrodes and an associated one of the external electrodes 47, 45 and 46 of the actuator body 4. That is, power can be supplied to the actuator body 4 via the pressing rubber 62 by supplying power to the terminal electrodes provided on the outer surface of the case 5.

The pressing rubber 62 presses the actuator body 4 in the lateral direction (i.e., the lateral direction corresponds to a pressing direction). This will be described in detail later. The pressing rubber 62 serves as a pressurizing member.

Instead of the pressing rubber 62, an elastic member such as a plate spring or the like may be employed.

The actuator body 4 placed in the case 5 is elastically supported relative to the case 5 by the plate spring 61. The plate spring 61 serves as a supporting member.

The plate spring 61 is a flat plate member having a quadrangular shape and is placed to face the mounting surface 40a of the actuator body 4 and have an attitude substantially in parallel to the mounting surface 40a. The plate spring 61 has openings 61a formed respectively at parts thereof corresponding to the driver elements 8. A body side joint portion 61b for connecting the plate spring 61 to the actuator body 4 is formed in a part of the plate spring 61 located between the openings 61a. Base side joint portions 61c for connecting the plate spring 61 to the case 5 are formed respectively in parts of the plate spring 61 located outside of an associated one of the openings 61a in the longitudinal direction.

The body side joint portion 61b is connected to a part of the mounting surface 40a of the actuator body 4 located between the driver elements 8 by an epoxy-based adhesive 61d. Each of the base side joint portions 61c is connected respectively to an end surface of an associated one of the first and second short side walls 52 and 53 of the case 5 in the lateral direction (of the actuator body 4) by epoxy-based adhesive 61e.

Each of the openings 61a is formed so as to have a larger opening size than a projected area of an associated one of the driver elements 8 when the driver elements 8 are projected to the plate spring 61 in the lateral direction (of the actuator body 4). Thus, when the plate spring 61 is connected to the actuator body 4 and the case 5, the driver elements 8 pass through the plate spring 61 via the openings 61a, respectively, and thus, the driver elements 8 and the plate spring 61 do not interfere with one another.

Furthermore, each of the openings 61a is formed so as to have a larger opening size than a projected area of a part of the actuator body 4 extending outwardly from an associated one of the driver elements 8 in the longitudinal direction to the plate spring 61. That is, when the actuator body 4 generates longitudinal vibration and bending vibration in the manner described above, interference of not only the driver elements 8 but also parts of the actuator body 4 extending outwardly from the driver elements 8 in the longitudinal direction with the plate spring 61 is prevented.

Figure 9:
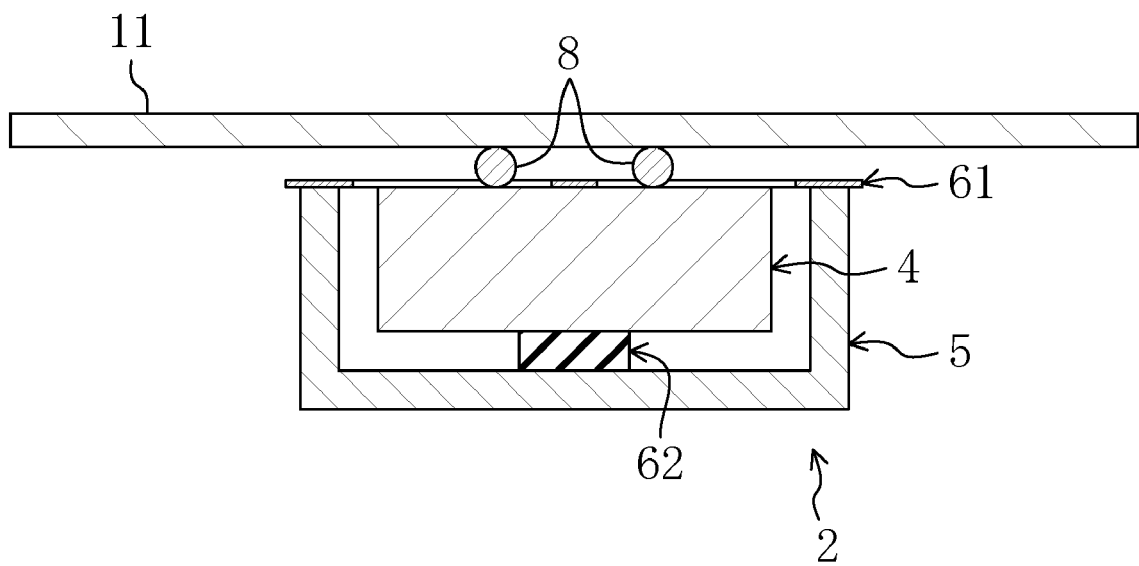
FIG. 9 is a cross-sectional view of an ultrasonic actuator.

As shown in FIGS. 2 and 9, the ultrasonic actuator 2 configured in the above-described manner is provided so that the driver elements 8 abut on the back surface of the stage 11, and the case 5 is fixed on the base (not shown). Specifically, the ultrasonic actuator 2 is placed so that the lateral direction of the actuator body 4 is orthogonal to the back surface of the stage 11 and the longitudinal direction of the actuator body 4 is parallel to the guides 12. In other words, the ultrasonic actuator 2 is arranged so that the direction of bending vibration of the actuator body 4 is orthogonal to the back surface of the stage 11 and the direction of longitudinal vibration of the actuator body 4 is parallel to the guides 12.

With the pressing rubber 62 compressed and deformed, the ultrasonic actuator 2 is placed, so that the actuator body 4 is pressed to the stage 11 by elastic force of the pressing rubber 62. That is, the driver elements 8 are pressed to the stage 11. Thus, even when the actuator body 4 is not vibrated, friction force acts between each of the driver elements 8 and the stage 11, so that the location of the stage 11 is held. Force pressing the ultrasonic actuator 2 to the stage 11 is determined by the elastic force of the pressing rubber 62.

The control unit receives an external operation command, and then, applies alternating voltages having a frequency corresponding to the operation command to the external electrodes 46 and 47, respectively, with a phase difference corresponding to the operation command.

As described above, the control unit causes the actuator body 4 i.e., the piezoelectric element unit 40 to generate longitudinal vibration and bending vibration in a cooperated manner, and thus causes the driver elements 8 to make an orbit motion in the manner shown in FIGS. 7(a)-7(d), thereby moving the stage 11. Specifically, to prevent abnormal heat generation in the actuator body 4, alternating voltages having a slightly higher frequency than a common resonance frequency for both longitudinal vibration and bending vibration of the actuator body 4 are applied to the external electrodes 46 and 47. In this case, the alternating voltages applied to the external electrodes 46 and 47 have phases shifted from one another by 90°.

When the actuator body 4 generates composite vibration of longitudinal vibration and bending vibration, each of the driver elements 8 makes an approximately elliptical motion in a plane including the longitudinal direction and the lateral direction of the actuator body 4. Thus, the driver elements 8 give driving force to the stage 11 through friction force along the longitudinal direction of the actuator body 4 while periodically repeating abutting on and separation from the stage 11, so that the stage 11 is moved along the guides 12. The longitudinal direction (coinciding with the direction in which the guides 12 extend) of the actuator body 4 corresponds to a driving direction in which the driver elements 8 output driving force.

Figure 10:
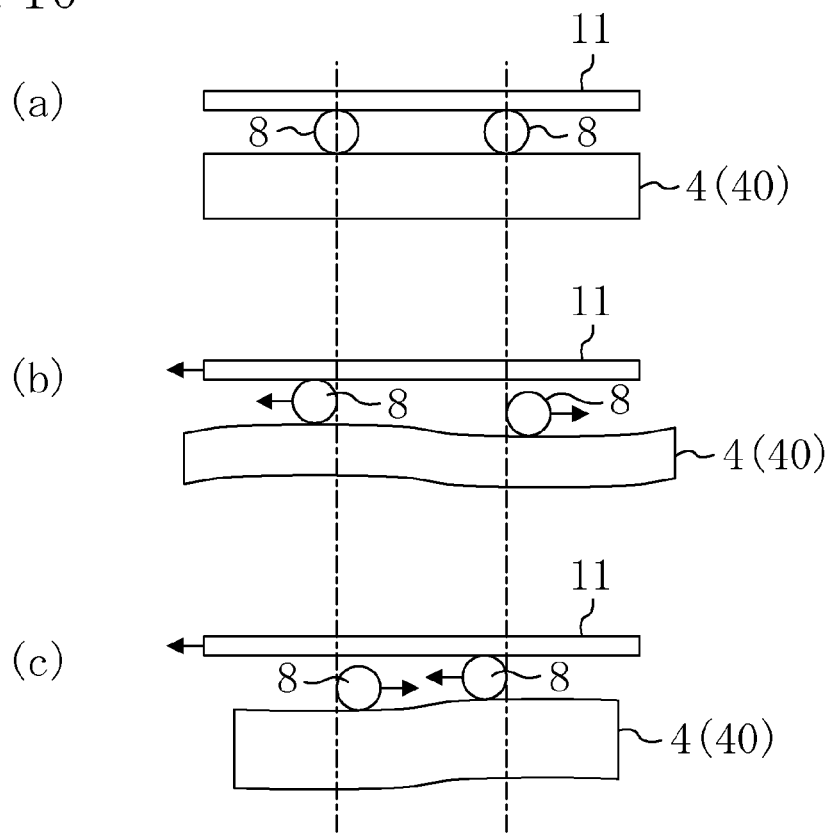
FIGS. 10(a)-10(c) are conceptual diagrams describing how a stage is driven by an ultrasonic actuator.

The driving of the stage 11 by the ultrasonic actuator 2 will be described in greater detail hereinafter with reference to FIGS. 10(a)-10(c). When the actuator body 4 expands along the longitudinal direction (vibration direction of longitudinal vibration), as shown in FIG. 10(b), one of the driver elements 8 (for example, shown on the left side of FIGS. 10(a)-10(c)) is displaced in a region closer to the stage 11 in the lateral direction (vibration direction of bending vibration). Thus, friction force with the stage 11 is increased, so that the stage 11 is moved by the friction force to the side (the left side of FIGS. 10(a)-10(c)) to which the one of the driver elements 8 is displaced along the longitudinal direction. In this case, the other one of the driver elements 8 (shown on the right side of FIGS. 10(a)-10(c)) is displaced in the opposite direction to the direction in which the one of the driver elements 8 is displaced along the longitudinal direction. However, because the other one of the driver elements 8 is displaced in a region less close to the stage 11 in the lateral direction (in which the one of the driver elements 8 moves away from the stage 11), the other one of the driver elements 8 moves away from the stage 11 and friction force does not act. Thus, the other one of the driver elements 8 hardly affects the movement of the stage 11.

When the actuator body 4 contracts along the longitudinal direction, as shown in FIG. 10(c), the other one of the driver elements 8 (shown on the right side of FIGS. 10(a)-10(c)) is displaced in a region closer to the stage 11 in the lateral direction. Thus, friction force with the stage 11 is increased, so that the stage 11 is moved by the friction force to the side (the left side of FIGS. 10(a)-10(c)) to which the other one of the driver elements 8 is displaced along the longitudinal direction. This moving direction is the same direction as the moving direction of the stage 11 by the one of the driver elements 8 when the actuator body 4 expands, which has been described above. In this case, the one of the driver elements 8 (shown on the left side of FIGS. 10(a)-10(c)) is displaced in the opposite direction to the direction in which the other one of the driver elements 8 is displaced along the longitudinal direction. However, because the one of the driver elements 8 is displaced in a region less close to the stage 11 in the lateral direction, the one of the driver elements 8 moves away from the stage 11 and friction force does not act. Thus, the one of the drive elements 8 hardly affects the movement of the stage 11.

In FIGS. 10(a)-10(c), the driver element 8 which does not affect the movement of the stage 11 is separated from the stage 11, but it does not have to be separated. That is, the driver element 8 may be in contact with the stage 11 by friction force which is small enough not to move the stage 11.

In this manner, the one of the driver elements 8 and the other one of the driver elements 8 alternately move the stage 11 in a predetermined direction with a phase difference of 180°. By applying alternating voltages having phases shifted by −90°, respectively, to the external electrodes 46 and 47, the direction of driving force output by the driver elements 8 can be reversed, so that the stage 11 can be moved in the other direction.

The amount of movement, moving speed and acceleration rate of the moving speed of the stage 11 can be adjusted by adjusting at least one of the voltage values, frequency and supply time of alternating voltages to be supplied to the external electrodes 46 and 47, by changing a phase difference for each of alternating voltages to be applied to the external electrodes 46 and 47, or like method.

As described above, the ultrasonic actuator 2 drives the stage 11 while causing each of the driver elements 8 to make an orbit motion in a plane including the vibration direction (longitudinal direction) of longitudinal vibration and the vibration direction (lateral direction) of bending vibration and thereby repeating increase and reduction of friction force between each of the driver elements 8 and the stage 11.

In the actuator body 4 for driving that the stage 11 through friction force between each of the driver elements 8 and the stage 11, when driving force is applied to the stage 11, reactive force acts on the actuator body 4 from the stage 11 via the driver elements 8. The reactive force acts on the actuator body 4 in the opposite direction to the direction in which the stage 11 is driven.

In the configuration in which the actuator body 4 is elastically supported, the actuator body 4 is displaced by the reactive force in the opposite direction to the direction in which the stage 11 is driven, so that driving force might not be efficiently transferred from the actuator body 4 to the stage 11. For example, in the configuration in which the actuator body 4 is supported relative to the case 5 only by the pressing rubber 62, reactive force which acts on the driver elements 8 acts as a moment of which a center is the pressing rubber 62 on the actuator body 4, so that the rotational displacement of the actuator body 4 around the pressing rubber 62 occurs, i.e., the actuator body 4 is tilted. As a result, the contact state of the driver elements 8 with the stage 11 becomes unstable, and thus, the ultrasonic actuator 2 cannot perform a stable operation.

In this embodiment, end portions of the actuator body 4 located at the side thereof on which the driver elements 8 are provided are supported relative to the case 5 by the plate spring 61.

Thus, the actuator body 4 can be supported at parts located near the driver elements 8. Accordingly, the distance between each of the driver elements 8 and the plate spring 61 for supporting the actuator body 4 relative to the case 5 is small, and thus, a moment which occurs due to reactive force and rotates the actuator body 4 is smaller than that in the configuration in which the actuator body 4 is supported only by the pressing rubber 62 relative to the case 5.

The spring constant of the plate spring 61 is much larger in the direction (in-plane direction) in which the plate spring 61 expands than in the normal direction of the plate spring 61. That is, the plate spring 61 is connected to the actuator body 4 and the case 5 so that the normal direction of the plate spring 61 is parallel to the pressing direction in which the actuator body 4 is pressed to the stage 11, and the direction in which the plate spring 61 expands is parallel to the driving direction of the stage 11, i.e., the direction of reactive force. Thus, the displacement of the actuator body 4 in the direction of reactive force can be restricted without interfering the displacement of the actuator body 4 in the pressing direction. It should be noted that because parts of the actuator body 4 to which the plate spring 61 is connected correspond to nodes of longitudinal vibration and bending vibration, even when the plate spring 61 restricts the displacement of the actuator body 4 in the direction of reactive force, the longitudinal vibration and the bending vibration of the actuator body 4 are not reduced.

Therefore, according to the first embodiment, the end surface of the actuator body 4 on which the driver elements 8 are provided, i.e., the mounting surface 40a is elastically supported by the plate spring 61 relative to the case 5. Thus, the distance between each of the driver elements 8 on which the reactive force from the stage 11 acts and the plate spring 61 which is the supporting member of the actuator body 4 is reduced, so that a moment which occurs due to reactive force and rotates the actuator body 4 can be reduced. As a result, the actuator body 4 can be prevented from being tilted, so that a contact state of each of the driver elements 8 with the stage 11 can be maintained in a stable manner. Accordingly, the ultrasonic actuator 2 can be operated in a stable manner.

It is preferable that each of the driver elements 8 is formed to have a size as small as the thickness of the plate spring 61, or the plate spring 61 is formed to have a thickness as large as the size of the driver elements 8, so that each of the driver elements 8 protrudes toward the stage 11 only by an amount corresponding to expected abrasion. Thus, the distance between each of the driver elements 8 and the plate spring 61 can be reduced, so that a moment which occurs due to reactive force can be reduced as small as possible. In addition, in the configuration in which the plate spring 61 is formed to have a large thickness, the rigidity of the plate spring 61 with respect to the moment which occurs due to the reactive force can be improved.

Also, the plate spring 61 is connected to the actuator body 4 and the case 5 so that the normal direction of the plate spring 61 is parallel to the pressing direction of the pressing rubber 62, and the direction in which a surface of the plate spring 61 expands is parallel to the driving direction in which driving force is output. Thus, the displacement of the actuator body 4 in the driving direction, i.e., the direction of reactive force can be restricted without interfering the displacement of the actuator body 4 in the pressing direction. In this case, joint portions of the actuator body 4 with the plate spring 61 are located to correspond to nodes of longitudinal vibration and bending vibration. Thus, even in the configuration in which the plate spring 61 is connected to one side surface of the actuator body 4 and the displacement of the actuator body 4 in the direction of reactive force is restricted by the plate spring 61, reduction of the longitudinal vibration and the bending vibration of the actuator body 4 can be prevented.

In other words, it is preferable that the actuator body 4 is supported by a supporting member of which the spring constant is larger in the driving direction than in the pressing direction. Thus, the displacement of the actuator body 4 in the pressing direction is not reduced, influences on pressing force which acts on the actuator body 4 can be reduced, and furthermore, the displacement of the actuator body 4 in the direction of reactive force can be restricted. Since the actuator body 4 is supported by a supporting member of which the spring constant is larger in the driving direction than in the pressing direction, the same advantages can be achieved even when the actuator body 4 is not supported near the driver elements 8 in the above-described manner. Also, in view of reducing a moment which acts on the actuator body 4, it is clear that the actuator body 4 is preferably supported near the driver elements 8.

Furthermore, a small spring constant of the plate spring 61 in the pressing direction can be obtained by placing the plate spring 61 so that the normal direction thereof extends along the pressing direction of the pressing rubber 62. Thus, influences of the plate spring 61 on pressing force to be given from the pressing rubber 62 to the actuator body 4 can be reduced. As a result, pressing force pressing the actuator body 4 to the stage 11 can be determined dominantly by the pressing rubber 62, so that stable pressing force can be caused to act on the actuator body 4.

Moreover, the openings 61a, each of which is larger than a projected area of the actuator body 4 to the plate spring 61 in the lateral direction, are formed respectively on parts of the plate spring 61 located outside of the body side joint portion 61b in the longitudinal direction of the actuator body 4, and thereby, when the vibration displacement of the actuator body 4 is caused, specifically, when the actuator body 4 generates bending vibration, interference of the actuator body 4 and the plate spring 61 can be prevented. Also, when the ultrasonic actuator 2 is placed relative to the stage 11, the actuator body 4 might be tilted with respect to the stage 11 because of variations between the two driver elements 8 in the size of the driver element 8 and the thickness of the adhesive. Even in such a case, interference between the actuator body 4 and the plate spring 61 can be prevented.

Second Embodiment

Next, an ultrasonic actuator 202 according to a second embodiment will be described. The ultrasonic actuator 202 of the second embodiment includes a supporting member having a different configuration from that of the supporting member of the first embodiment. Each member also shown in the first embodiment is identified by the same reference character, the description thereof will be omitted, and the configuration of each of different parts will be mainly described.

Figure 11:
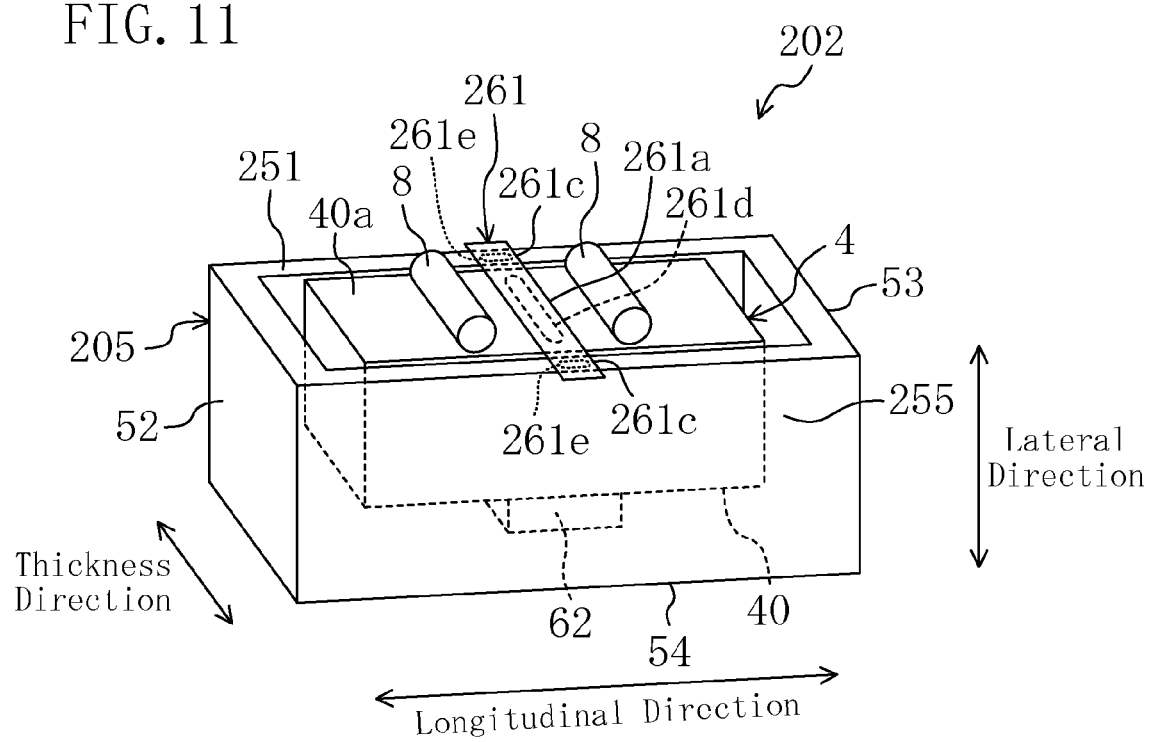
FIG. 11 is a perspective view of an ultrasonic actuator according to a second embodiment.

As shown in FIG. 11, the ultrasonic actuator 202 of the second embodiment is supported relative to a case 205 by a plate spring 261.

The case 205 of the second embodiment is different from the case 5 of the first embodiment in that the case 205 is not open at one side in the thickness direction of the actuator body 4 and a wall portion is provided at the side. Specifically, the case 205 is configured so that a first main wall portion 251 and a second main wall portion 255 are provided to be parallel to the principal surface of the actuator body 4 and face one another.

The plate spring 261 of the second embodiment is formed to have a long and narrow plate shape, which is a different shape from that of the plate spring 61 of the first embodiment. With the actuator body 4 placed in the case 205, the plate spring 261 is provided to extend between the driver elements 8 from the first main wall portion 251 to the second main wall portion 255 of the case 205 in the thickness direction of the actuator body 4. In this case, the plate spring 261 is substantially parallel to the mounting surface 40a of the actuator body 4.

Base side joint potions 261c are formed respectively at both end portions of the plate spring 261. Each of the base side joint potions 261c is connected to one end surface of an associated one of the first and second main wall portions 251 and 255 of the case 205 in the lateral direction (of the actuator body 4) by an epoxy adhesive 261e. A body side joint portion 261a is formed at a middle portion of the plate spring 261. The body side joint portion 261a is connected to a part of the mounting surface 40a of the actuator body 4 located between the driver elements 8 by an epoxy adhesive 261d.

Therefore, according to the second embodiment, the actuator body 4 is supported relative to the case 5 by the plate spring 261 at one end surface of the actuator body 4 on which the driver elements 8 are provided, i.e., the mounting surface 40a. Thus, the distance between each of the driver elements 8 on which reactive force from the stage 11 acts and the plate spring 261 which is a supporting member of the actuator body 4 can be reduced, and a moment which occurs due to the reactive force and rotates the actuator body 4 can be reduced. As a result, the actuator body 4 can be prevented from being tilted, and thus, a contact state of the driver elements 8 with the stage 11 can be maintained in a stable manner. As compared to the first embodiment, the distance between each of the driver elements 8 and the plate spring 261 (specifically, the base side joint potions 261c of the plate spring 261) can be reduced, thus achieving more significant advantage in reducing the moment.

The plate spring 261 is connected to the actuator body 4 and the case 205 so that the normal direction of the plate spring 261 is parallel to the pressing direction of the pressing rubber 62 and the direction in which the plane of the plate spring 261 expands is parallel to the driving direction in which driving force is output, and thereby, the displacement of the actuator body 4 in the driving direction, i.e., the direction of the reactive force can be restricted without interfering the displacement of the actuator body 4 in the pressing direction. In this case, joint portions of the actuator body 4 with the plate spring 261 are located to correspond to nodes of longitudinal vibration and bending vibration. Thus, even in the configuration in which the plate spring 261 is connected to one side surface of the actuator body 4 and the plate spring 261 restricts the displacement of the actuator body 4 in the direction of reactive force, reduction of longitudinal vibration and bending vibration of the actuator body 4 can be prevented.

Furthermore, as compared to the first embodiment, the configuration of the plate spring 261 can be simplified.

In addition, the same effects and advantages as those of the first embodiment can be achieved.

Third Embodiment

Next, an ultrasonic actuator 302 according to a third embodiment will be described. The ultrasonic actuator 302 of the third embodiment is different from the ultrasonic actuator of the first embodiment in that the ultrasonic actuator 302 has a different attachment configuration for attachment to a movable body and a fixed body from that of the first embodiment. Each member also shown in the first embodiment is identified by the same reference character, the description thereof will be omitted, and the configuration of each of different parts will be mainly described.

Figure 12:
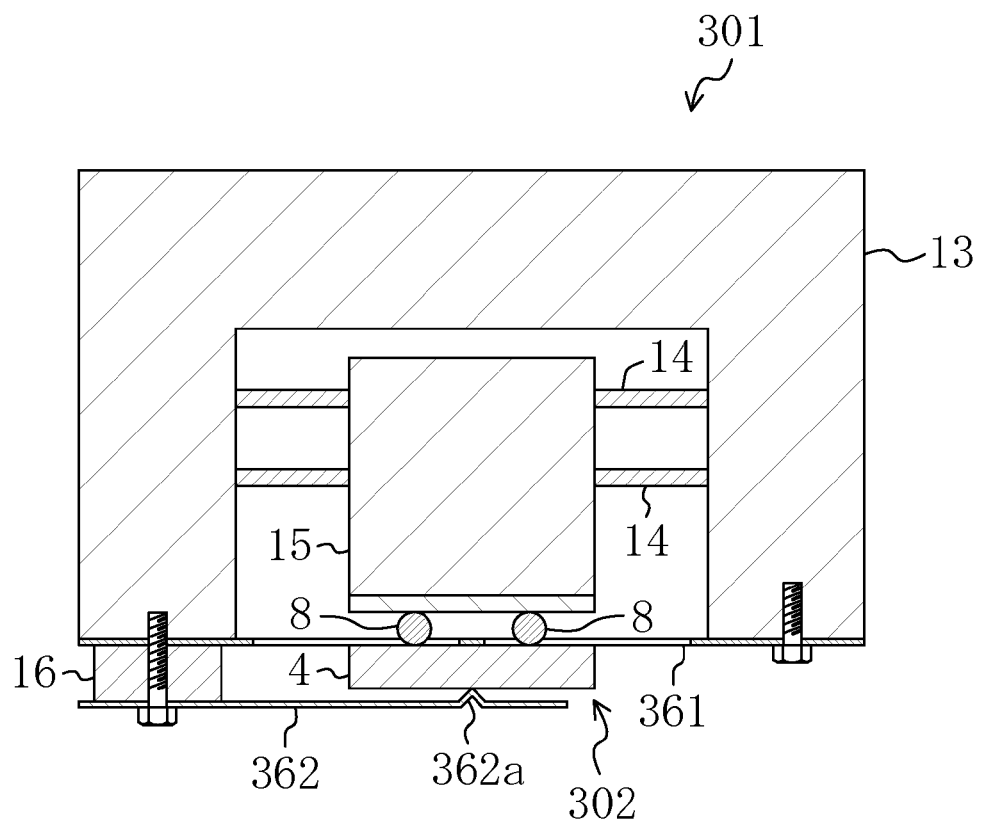
FIG. 12 is a front view of a drive unit according to a third embodiment.

Specifically, as shown in FIG. 12, a drive unit 301 according to the third embodiment includes a fixed frame 13 as a fixed body formed to have a square U-shape, a pair of guide rails 14 provided to extend in parallel to one another in the fixed frame 13, a stage 15 attached to the guide rails 14 so as to be capable of sliding, and an ultrasonic actuator 302.

In the ultrasonic actuator 302, the actuator body 4 is connected to a supporting plate spring 361, and each of end portions of the supporting plate spring 361 is fixed to an associated one of end portions of the fixed frame 13 (serving as a fixed body) formed to have a square U-shape via a bolt. That is, the fixed frame 13 serves as a fixed body and a base member.

In this case, at one of the end portions of the supporting plate spring 361, a pressing plate spring 362 is fastened together by a bolt with a spacer 16 interposed between the supporting plate spring 361 and the pressing plate spring 362. The pressing plate spring 362 is provided so that the one of the end portions thereof is fixed to the fixed frame 13 by the bolt and the other one of the end portions thereof is a free end. At the other one of the end portions of the pressing plate spring 362, a pressing section 362a is formed by bending a part of the pressing plate spring 362. The pressing plate spring 362 is configured to be fixed to the fixed frame 13 so that the pressing section 362a presses the actuator body 4 to the stage 15. The pressing plate spring 362 serves as a pressurizing member.

The actuator body 4 is elastically supported to the fixed frame 13 by the supporting plate spring 361, and is pressed to the stage 15 by the pressing plate spring 362. In this case, the supporting plate spring 361 is placed so that the normal direction of the supporting plate spring 361 is parallel to the pressing direction of the pressing plate spring 362 and the direction in which the plane expands is parallel to the driving direction. Thus, the supporting plate spring 361 can restrict the displacement of the actuator body 4 in the driving direction, i.e., the direction of reactive force from the stage 15 without interfering the displacement of the actuator body 4 in the pressing direction. It is preferable that the supporting plate spring 361 is connected to nodes of the actuator body 4 of vibration of the actuator body 4.

Power is supplied to the actuator body 4 through the wires (not shown) connected respectively to the external electrodes 47, 45 and 46.

Thus, according to the third embodiment, as in the first embodiment, the actuator body 4 can be supported near the driver elements 8, and thus, a moment which occurs due to the reactive force from the stage 15 and rotates the actuator body 4 can be reduced.

By placing the supporting plate spring 361 to be parallel to the driving direction of the actuator body 4, the displacement of the actuator body 4 in the driving direction, i.e., the direction of the reactive force can be restricted. In addition, by placing the supporting plate spring 361 so that the normal direction of the supporting plate spring 361 is parallel to the pressing direction of the pressing plate spring 362, reduction of vibration and the displacement of the actuator body 4 in the pressing direction can be prevented.

Other Embodiments

According to the present invention, in connection with the first through third embodiments described above, an ultrasonic actuator may have the following configuration.

That is, in each of the first through third embodiments, each of the plate springs 61, 261 and 361 is connected to the mounting surface of the actuator body 4 on which the driver elements 8 are provided. However, the configurations of the first through third embodiments are not limited thereto. For example, the configuration of each of the first through third embodiments may be a configuration in which an associated one of the plate springs 61, 261 and 361 is connected to end portions of principal surfaces or short side surfaces of the actuator body 4, which are located close to the mounting surface 40a, i.e., parts of the actuator body 4 located close to the driver elements 8 in the lateral direction. Specifically, by connecting the plate springs 61, 261 and 361 not to the mounting surface 40a but to the end portions of the principal surfaces or the short side surfaces of the actuator body 4, which are located close to the driver elements 8, the distance between each of the driver elements 8 and each of the plate springs 61, 261 and 361 can be reduced, so that a moment which occurs due to reactive force and rotates the actuator body 4 can be reduced.

Figure 13:
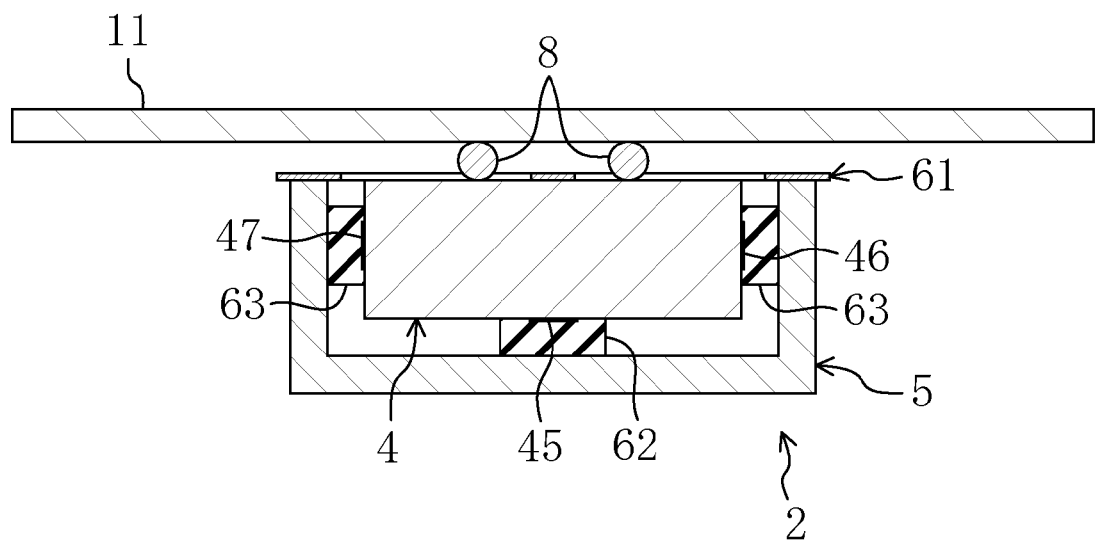
FIG. 13 is a cross-sectional view of an ultrasonic actuator according to another embodiment.

In each of the first through third embodiments, in the actuator body 4, external electrodes 47, 45 and 46 are formed on one long side surface, and power is supplied to the external electrodes 47, 45 and 46 by a single pressing rubber 62. However, the configurations of the first through third embodiments are not limited thereto. For example, as shown in FIG. 13, a configuration in which the external electrodes 47, 45 and 46 are provided on different side surfaces of the actuator body 4, respectively, and, in addition to the pressing rubber 62, two other power supply rubbers 63 are provided so that power is supplied to the external electrodes 47, 45 and 46 via the pressing rubber 62 and the power supply rubbers 63 may be employed.

Figure 14:
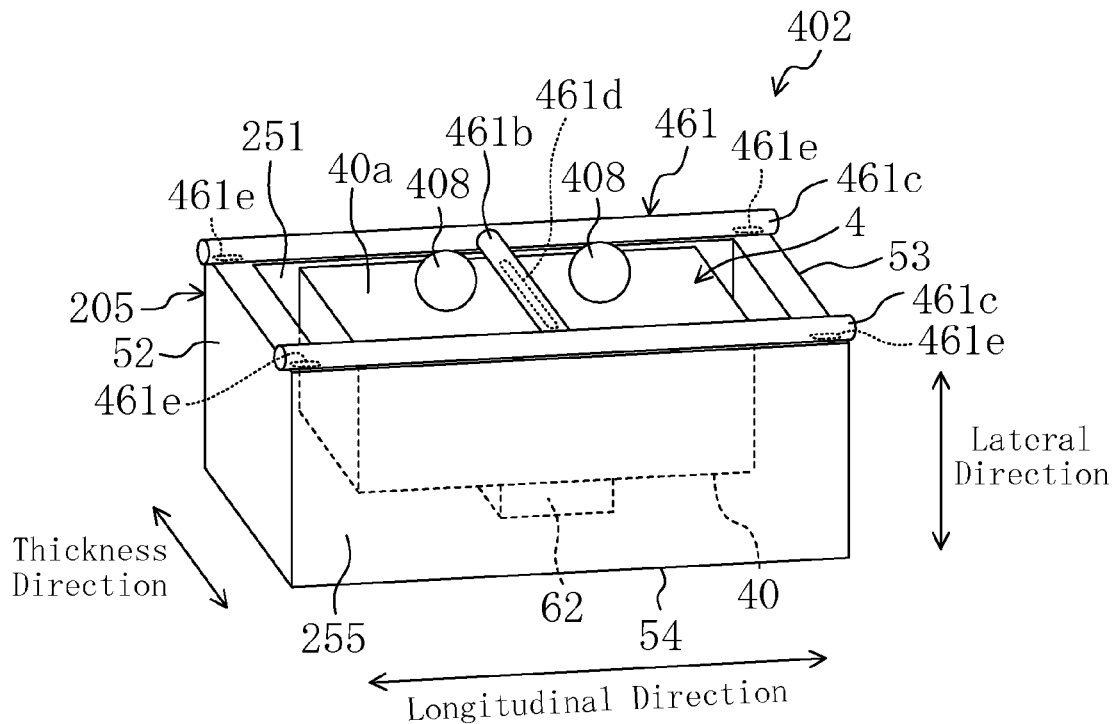
FIG. 14 is a perspective view of an ultrasonic actuator according to still another embodiment.

Also, in each of the first through third embodiments, a supporting member is formed by a plate spring. However, the supporting member is not limited thereto. For example, as shown in FIG. 14, a supporting member 461 formed of cylindrical members may be employed. In such a case, the actuator body 4 can be supported near driver elements 408 by the supporting member 461. Thus, the distance between each of the driver elements 408 on which reactive force acts and the supporting member 461 which supports the actuator body 4 can be reduced, so that a moment which acts on the actuator body 4 due to reactive force can be reduced. Note that each of the driver elements 408 is formed not to have a cylindrical shape but a spherical shape.

The spring constant of the cylindrical members in the axis direction of the cylindrical members is very large, as compared to that in the bending direction thereof. Therefore, at least one of the cylindrical members forming the supporting member 461 is placed so that the axis thereof is parallel to the driving direction, i.e., the direction of reactive force, and thus, the actuator body 4 can be firmly supported in the direction of the reactive force. Specifically, as shown in FIG. 14, the supporting member 461 includes a body side joint portion 461b extending in the thickness direction of the actuator body 4, and a pair of base side joint portions 461c connected respectively to both end portions of the body side joint portion 461b and extending in the longitudinal direction of the actuator body 4. That is, the base side joint portions 461c are placed so that the axis of each of the base side joint portions 461c is parallel to the driving direction, i.e., the direction of reactive force. The body side joint portion 461b is connected to a part of the mounting surface 40a of the actuator body 4 located between the driver elements 408 by an epoxy adhesive 461d. End portions of each of the base side joint portions 461c are connected to end portions of the first and second short side walls 52 and 53 of the case 5 in the lateral direction (of the actuator body 4) by an epoxy adhesive 461e. Thus, even when the actuator body 4 receives reactive force from the stage 11 via the driver elements 408, the reactive force can be received at the base side joint portions 461c, so that the displacement of the actuator body 4 in the direction of the reactive force can be reduced. Also, the body side joint portion 461b is connected to a part of the actuator body 4 corresponding to a node, and the bending direction of the body side joint portion 461b and the base side joint portions 461c coincides with the pressing direction of the actuator body 4. Thus, the displacement of the actuator body 4 in the pressing direction is not reduced.

Furthermore, the shape, number, material and the like of the driver elements 8 are not limited to those described in the above-described embodiments. A driver element(s) of any shape, number, material and the like may be employed.

The ultrasonic actuator 2 is configured to cause the actuator body 4 to generate the first-order mode of longitudinal vibration along the longitudinal direction and the second-order mode of bending vibration in a cooperated manner, but is not limited to such a configuration. The ultrasonic actuator 2 may have a configuration in which some other type of vibration or mode is induced. As long as a vibratory actuator in which the actuator body 4 is vibrated to output driving force through friction force between each of the driver elements 8 and the stage 11 can be provided, any configuration can be employed.

The ultrasonic actuator 2 is not limited to the above-described configuration. For example, the ultrasonic actuator 2 may have a configuration in which a lead line is connected to the actuator body 4 to supply power to the actuator body 4, instead of a configuration in which the power is supplied to the actuator body 4 via the pressing rubber 62. Also, the ultrasonic actuator 2 may have a configuration in which node portions (nodes) of vibration of the actuator body 4 are supported by an inelastic member.

The actuator body 4 is formed of the piezoelectric element unit 40. However, the actuator body 4 may have a configuration in which a piezoelectric element is attached to a substrate of metal or the like or a configuration in which an oscillator is made of metal or the like and a piezoelectric element is inserted therein. In such a configuration, an oscillator including a piezoelectric element serves as an actuator body.

Figure 15:
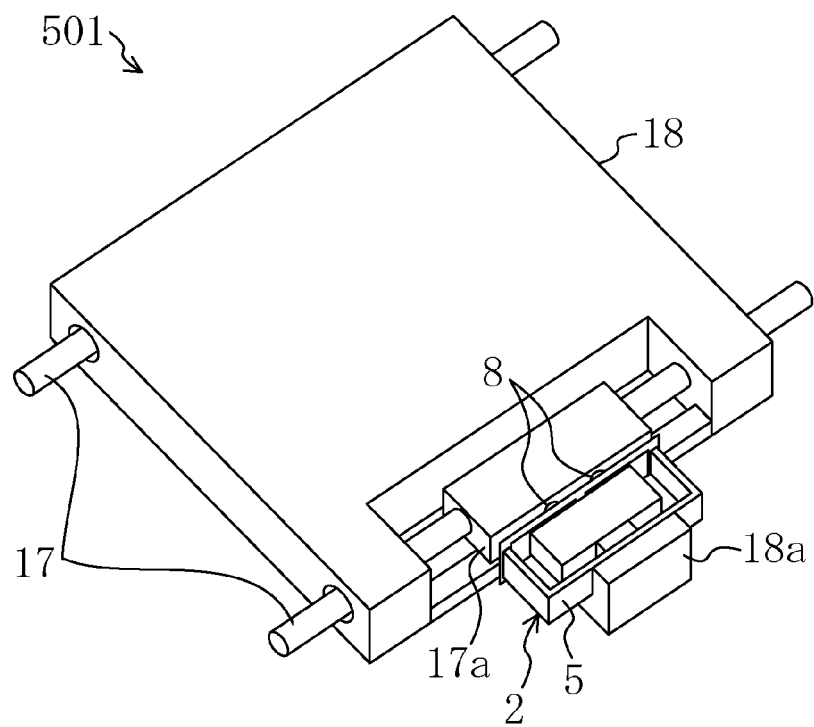
FIG. 15 a perspective view of a driver unit according the another embodiment.

Furthermore, in the above-described embodiments, the ultrasonic actuator 2 is fixed to the base and the driver elements 8 are provided to abut on the movable stage 11 to operate the ultrasonic actuator 2, thereby driving the stage 11. However, as shown in FIG. 15, a configuration in which the ultrasonic actuator 2 is fixed to a stage may be employed. Specifically, a drive unit 501 includes guides 17 fixed to a base in parallel to one another, a stage 18 attached to the guides 17 so as to be capable of sliding, and the ultrasonic actuator 2. On one of the guides 17, an abutment member 17a fixed to the guide 17 is provided. An actuator attaching portion 18a is provided on the stage 18. Moreover, the ultrasonic actuator 2 is configured so that the driver elements 8 abut on the abutment member 17a of the guide 17 and the case 5 is attached to the actuator attaching portion 18a of the stage 18. In this state, when the ultrasonic actuator 2 is operated, the driver elements 8 output driving force to the abutment member 17a. Since the abutment member 17a is fixed, the ultrasonic actuator 2 itself is vibrated along the longitudinal direction of the guides 17 relatively to the abutment member 17a. As a result, the stage 18 connected to the case 5 via the actuator attaching portion 18a is driven in the longitudinal direction of the guides 17. The abutment member 17a serves as a fixed body.

Figure 16:
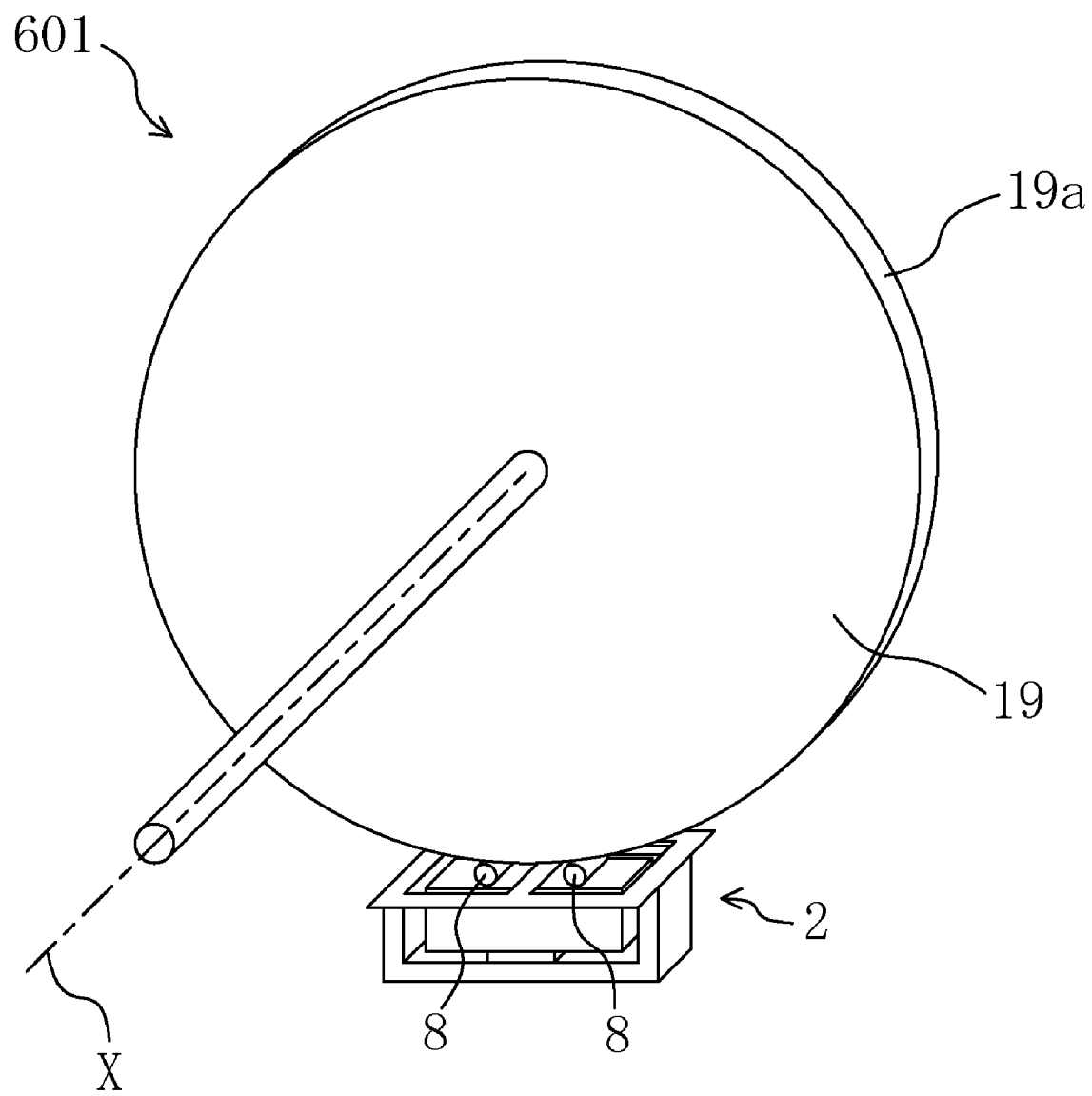
FIG. 16 is a perspective view of a driver unit according the still another embodiment.

In the above-described embodiments, the stage 11 driven by giving driving force of the ultrasonic actuator thereto has a flat plate shape. However, the shape of the stage is not limited thereto, but any configuration may be employed as a configuration of a movable body. For example, as shown in FIG. 16, a drive unit 601 in which a circular plate body 19 capable of spinning about a predetermined axis X is a movable body and driver elements 8 of an ultrasonic actuator are configured to abut on a circumferential surface 19a of the circular plate body 19 may be employed. In such a configuration, when the ultrasonic actuator is driven, the circular plate body 19 is caused to spin about the predetermined axis X due to an approximate elliptical motion of the driver elements 8. The circular plate body 19 serves as a movable body.

Figure 17:
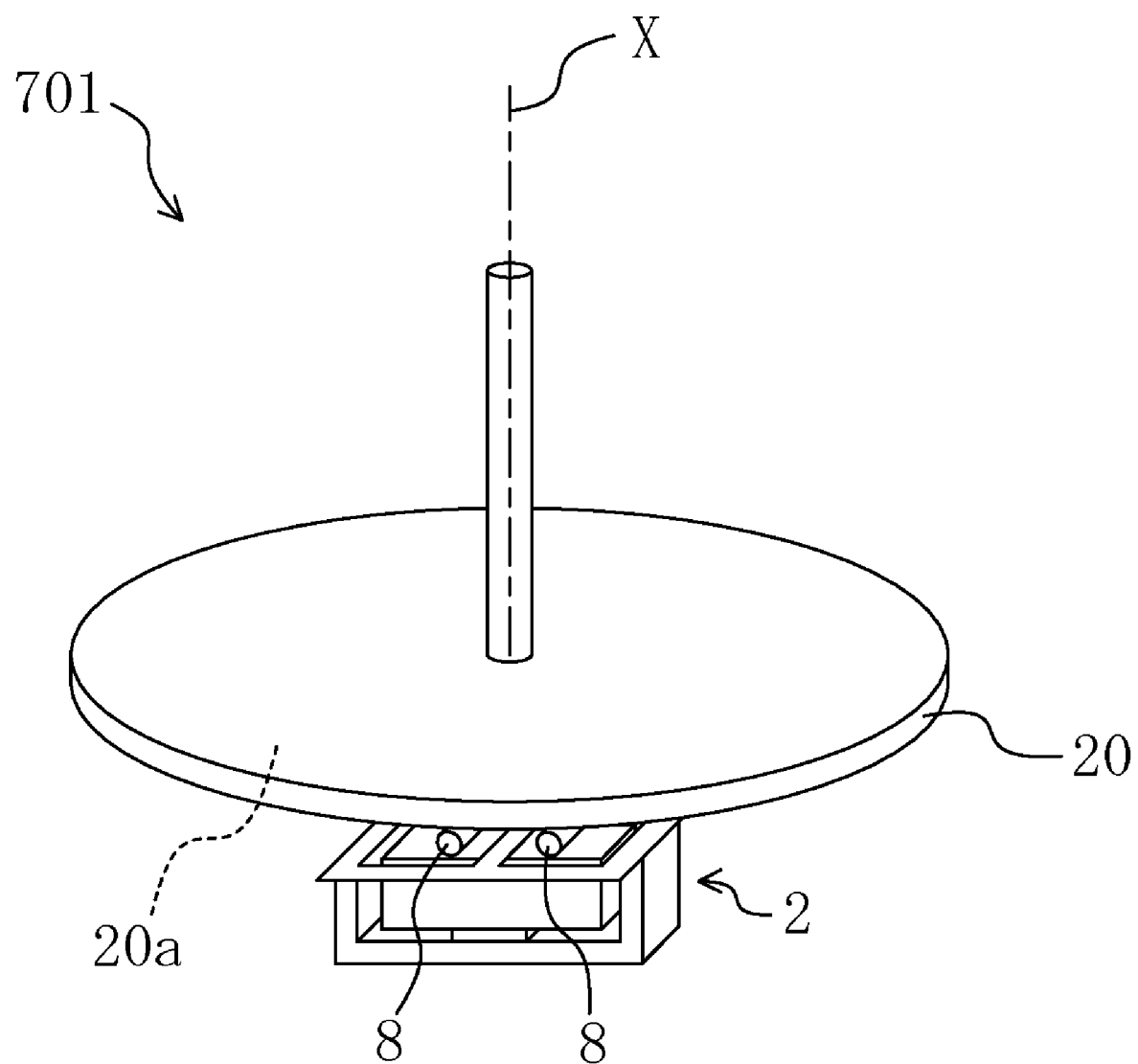
FIG. 17 is a perspective view of a driver unit according yet another embodiment.

Also, as shown in FIG. 17, a drive unit 701 in which a circular plate body 20 capable of spinning about a predetermined axis X is a movable body and driver elements 8 of an ultrasonic actuator are configured to abut on a planar portion 20a of the circular plate body 20 may be employed. In such a configuration, when the ultrasonic actuator is driven, the circular plate body 20 is driven due to an approximate elliptical motion of the driver elements 8 in a direction along a tangential direction of the circular plate body 20 at its portion on which each driver element 8 abuts, and, as a result, the circular plate body 20 spins about the predetermined axis X. The circular plate body 20 serves as a movable body.

Note that the above-described embodiments have been set forth merely for purposes of preferable examples and are not intended to limit the scope, applications, and use of the invention.

INDUSTRIAL APPLICABILITY

As has been described, the present invention is useful for a vibratory actuator which drives a movable body, including an actuator body including a piezoelectric element, for generating a plurality of vibrations having different vibration directions, and specifically, a compact vibratory actuator which can drive a movable body in a precise manner.

The invention claimed is:

1. A vibratory actuator for driving a movable body provided to be movable relative to a fixed body, comprising:
   an actuator body, including a piezoelectric element, for generating vibration;
   a driver element provided on one side surface of the actuator body and configured to be operated according to the vibration of the actuator body, thereby outputting driving force;
   a pressurizing member, provided at an opposite side to a side of the actuator body at which the driver element is provided, for pressing the actuator body to one of the fixed body and the movable body on which the driver element abuts;
   a base member to which the actuator body is coupled; and
   a supporting member for elastically supporting the actuator body relative to the base member,
   wherein
   the supporting member is a plate spring member provided in parallel to the one side surface of the actuator body, is connected to the one side surface of the actuator body, and has a larger spring constant in a driving direction in which the driver element outputs driving force than a spring constant in a pressing direction in which the pressurizing member presses the actuator body.

2. The vibratory actuator of claim 1,
   wherein
   the supporting member is connected to a node of vibration of the actuator body.

3. The vibratory actuator of claim 1,
   wherein
   the supporting member includes a body side joint portion to be connected to the one side surface of the actuator body, and a base side joint portion to be connected to the base member, and has an opening portion, formed in a part corresponding to the driver element, for preventing interference with the driver element.

* * * * *